US005809389A

United States Patent [19]

Tamura et al.

[11] Patent Number: 5,809,389

[45] Date of Patent: Sep. 15, 1998

[54] FIXING DEVICE FOR ELECTROPHOTOGRAPHIC DEVICE

[75] Inventors: Toshihiro Tamura; Toshiaki Kagawa, both of Sakurai; Shogo Yokota, Fujiidera, all of Japan

[73] Assignee: Sharp Kabushiki Kaisha, Osaka, Japan

[21] Appl. No.: 766,559

[22] Filed: Dec. 13, 1996

[30] Foreign Application Priority Data

Dec. 14, 1995 [JP] Japan .................................... 7-325707

[51] Int. Cl.[6] ........................................ H03G 15/20

[52] U.S. Cl. .................................. 399/22; 399/330

[58] Field of Search .......................... 399/322, 328, 399/329, 330, 331, 339; 219/216; 118/60; 432/60

[56] References Cited

U.S. PATENT DOCUMENTS

| | | | |
|---|---|---|---|
| 5,212,529 | 5/1993 | Morris et al. | 355/290 |
| 5,319,430 | 6/1994 | DeBolt et al. | 399/322 |
| 5,485,259 | 1/1996 | Uehara et al. | 399/325 |
| 5,614,999 | 3/1997 | Kanesawa et al. | 399/329 |
| 5,655,202 | 8/1997 | Yoshimura et al. | 399/330 |

FOREIGN PATENT DOCUMENTS

| | | |
|---|---|---|
| 0506046 | 9/1992 | European Pat. Off. . |
| 0770935 | 5/1997 | European Pat. Off. . |
| 19600211 | 9/1996 | Germany . |
| 55-36996 | 9/1980 | Japan . |
| 59-204070 | 11/1984 | Japan . |
| 60-238879 | 11/1985 | Japan . |
| 1-015780 | 1/1989 | Japan . |
| 1-304481 | 12/1989 | Japan . |
| 08262893 | 10/1996 | Japan . |

OTHER PUBLICATIONS

"Energy–Saving Technology in the Fixing System", T. Watanabe et al., Electrophotographic Institute, Vo. 31, No. 2, pp. 156–163, 1992.

"Trend in Energy–Saving Technology in Fixing", K. Akiyama, Resume prepared for the 40th Short Class of Electrophotographic Institute, pp. 31–38, 1995.

"New Fixing System Which can Reduce Warm–Up Time Remarkably", S. Kimura et al., Journal of Electrophotographic Institute, vol. 30, No. 4, pp. 398–402, 1991.

"Subminiature Waitless Fixing System with Pressure Pad", T. Kagawa et al., Japan Hardcopy '96 of Electrophotographic Institute, pp. 133–136.

*Primary Examiner*—Joan H. Pendegrass
*Attorney, Agent, or Firm*—David G. Conlin; David D. Lowry

[57] ABSTRACT

A fixing device has a fixing roller, a press member disposed in a press state in an axial direction of the fixing roller on the periphery surface thereof, and a transport guide for guiding transport of paper. The press member is formed so that the free height of a guide part on an upstream side with respect to the transport direction of the paper is lower than that of the pressure portion pressed to the fixing roller via a heat resistant sheet. Therefore, since the apparent elasticity hardness of the pressure portion can be made relatively small, the nip width formed by the fixing roller and the press member can be made large. Consequently, the fixing of toner to the paper is improved. Even when, for example, a thin sheet of paper or an envelope is used as the paper, the fixing device can suppress the occurrence of paper jam, such as paper lodging, and improper paper insertion.

17 Claims, 9 Drawing Sheets

FIXING DEVICE FOR ELECTROPHOTOGRAPHIC DEVICE

FIELD OF THE INVENTION

The present invention relates to fixing devices incorporated in apparatuses using an electrophotographic method, such as, copying machines, printers, and facsimiles.

BACKGROUND OF THE INVENTION

Conventionally, a fixing device that is composed of a fixing roller and a pressure roller pressed to that fixing roller is incorporated in apparatuses using an electrophotographic method, such as, copying machines, printers, and facsimiles. The fixing device is configured so that at least one of the fixing and pressure rollers is heated. As a recording material is transported between the fixing and pressure rollers, an image is fixed on the recording material. This method is generally referred to as a roller method.

FIG. 10 shows an example of a fixing device of a heat roller type employing the above-mentioned roller method. As shown in FIG. 10, a fixing device 201 includes a fixing roller 202, a heater lamp 203 and a pressure roller 205. The pressure roller 205 is formed by providing heat resistant rubber 206 made of, for example, silicon solid rubber around a metal shaft 204 made of, for example, SUS 304 in a cylindrical form. The pressure roller 205 is pushed to the fixing roller 202 by springs (not shown) that are disposed near both ends thereof so as to create pressure necessary for fixing the image.

Nonetheless, in the fixing device 201 of the above-mentioned roller method, a pair of rollers, i.e., the fixing roller 202 and the pressure roller 205, need to be rotated in synchronization. In addition, the fixing roller 202 and the pressure roller 205 need to be supported so as to be capable of rotating freely. Therefore, the fixing device 201 configured in the above manner has a complex structure, which raises the price of the device and increases the size of the device.

In order to solve these problems, for example, Japanese Publication for Examined Patent Application No. 55-36996/1980 (Tokukoushou 55-36996) discloses a fixing device employing a press pad method that uses an unrotatable press member instead of the pressure roller.

The press pad method fixes an image by pressing the press member to a fixing roller and then transporting a recording material between the fixing roller and the press member. FIG. 11 shows an example of such a fixing device employing the press pad method.

As shown in FIG. 11, a fixing roller 112 is so configured as to include a hollow roller 112*a* made of aluminum and a coating layer 112*b* for coating the periphery surface of the hollow roller 112*a*. The coating layer 112*b* is made of synthetic resin of good mold release, paper transport and heat resistance properties, for example, a material having a large friction coefficient such as silicon rubber. The fixing roller 112 has a heater lamp 113 therein. A press member 111 is disposed below the fixing roller 112.

On the surface of the press member 111, that faces the fixing roller 112, i.e., on the press surface, is provided, for example, a coating layer 114 made of a material having a small friction coefficient such as polytetrafluoroethylene resin. The press member 111 is fixed on the upper surface of a pressing plate 116 supported by a shaft 117, and pressed to the fixing roller 112 with a predetermined push force by a pressure spring 118. A sheet of paper 101 having thereon a toner image 102 that has not yet been fixed is transported and pressed between the fixing roller 112 and the press member 111 so that the toner image 102 that has not yet been fixed will be fixed on the sheet of paper 101.

Nevertheless, the conventional fixing device employing the above-mentioned press pad method has the following problems.

1. The area of the press surface where the press member 111 is pressed to the fixing roller 112, i.e., the contact area (nip), is small. Therefore, the fixing to the sheet of paper 101 of the toner image 102 that has not yet been fixed becomes poor.

2. If the sheet of paper 101 having thereon the toner image 102 that has not yet been fixed is, for example, a thin sheet of paper or an envelope, the sheet of paper 101 is not properly inserted into the nip portion formed between the fixing roller 112 and the press member 111. Therefore, paper jam is likely to occur due to, for example, paper lodging.

3. Since the springs press the end portions of the fixing roller 112 or the end portions of the press member, the push force is not properly applied to the mid-portion of the fixing roller 112, compared to the end portions thereof. Consequently, the pressure applied to the sheet of paper 101 shows a non-uniform distribution in the axial direction of the fixing roller 112. In other words, the image is not properly fixed at the mid-portion of the fixing roller 112, compared to the end portions thereof.

SUMMARY OF THE INVENTION

An object of the present invention is to offer a highly durable and reliable fixing device that is small in size and that has good fixing and paper transportation properties.

In order to accomplish the object, the fixing device in accordance with the present invention is characterized in that it has: a fixing roller; and a press member disposed in a press state in an axial direction of the fixing roller on the periphery surface of the fixing roller, wherein the press member is formed so that the free height of an upstream side thereof with respect to a transport direction of a recording material is lower than the free height of a pressure portion thereof with the fixing roller.

With the above configuration, the press member is formed so that the free height of an upstream side thereof with respect to a transport direction of a recording material is lower than the free height of a pressure portion thereof with the fixing roller. Therefore, since the apparent elasticity hardness of the pressure portion can be made relatively small, the nip width formed by the fixing roller and the press member can be made large. Therefore the fixing of an image to the recording material is improved. In addition, a transport path of the recording material to a nip portion can be made to become narrower gradually by using the press member configured as above. Consequently, even when, for example, a thin sheet of paper or an envelope is used as the recording material, the fixing device can suppress occurrence of paper jam, such as paper lodging, and improper paper insertion. This makes it possible to offer a highly durable and reliable fixing device that is small in size and that has good fixing and paper transportation properties.

In order to accomplish the object, the fixing device in accordance with the present invention is characterized in that it has: a fixing roller; and a press member disposed in a press state in an axial direction of the fixing roller on the periphery surface of the fixing roller, wherein the press member is formed to be higher toward the fixing roller at the mid-portion thereof than at the end portions thereof with respect to the axial direction of the fixing roller.

With the above configuration, the press member is formed to be higher toward the fixing roller at the mid-portion thereof than at the end portions thereof with respect to the axial direction of the fixing roller. Therefore, it is possible to increase the push force applied to the mid-portion. Therefore, the nip width formed by the fixing roller and the press member can be made wider than in a conventional configuration, and thereby can be made uniform. Consequently, the fixing of an image to the recording material is improved. Besides, by using the press member configured as above, a metal shaft of the fixing roller does not need to be hard and strong in order to increase the push force applied at the mid-portion. Consequently, the fixing device can reduce its size and costs. This makes it possible to offer a highly durable and reliable fixing device that is small in size and that has good fixing and paper transportation properties.

In order to accomplish the object, the fixing device in accordance with the present invention is characterized in that it has: a fixing roller; a press member disposed in a press state in an axial direction of the fixing roller on the periphery surface of the fixing roller; and a transport guide for guiding transport of a recording material, wherein the transport guide is formed to be upwardly concave with respect to the transport direction of the recording material.

With the above configuration, the transport guide is formed to be upwardly concave with respect to the transport direction of the recording material. Therefore, the recording material deflects (bends) downward when inserted into the nip portion. Therefore, even when soft paper is used, the occurrence of paper jam, such as paper lodging, and improper paper insertion can be further suppressed. In addition, even when the area of the image is large, improper image is not likely to occur. The fixing of the image to the recording material is further improved. This makes it possible to offer a highly durable and reliable fixing device that is small in size and that has good fixing and paper transportation properties.

For a fuller understanding of the nature and advantages of the invention, reference should be made to the ensuing detailed description taken in conjunction with the accompanying drawings.

DESCRIPTION OF THE EMBODIMENTS

[FIRST EMBODIMENT]

Referring to FIGS. 1 through 5, the following description will discuss an embodiment in accordance with the present invention. The present embodiment will explain an example in which a fixing device in accordance with the present invention is incorporated in a laser printer.

Figure 2:
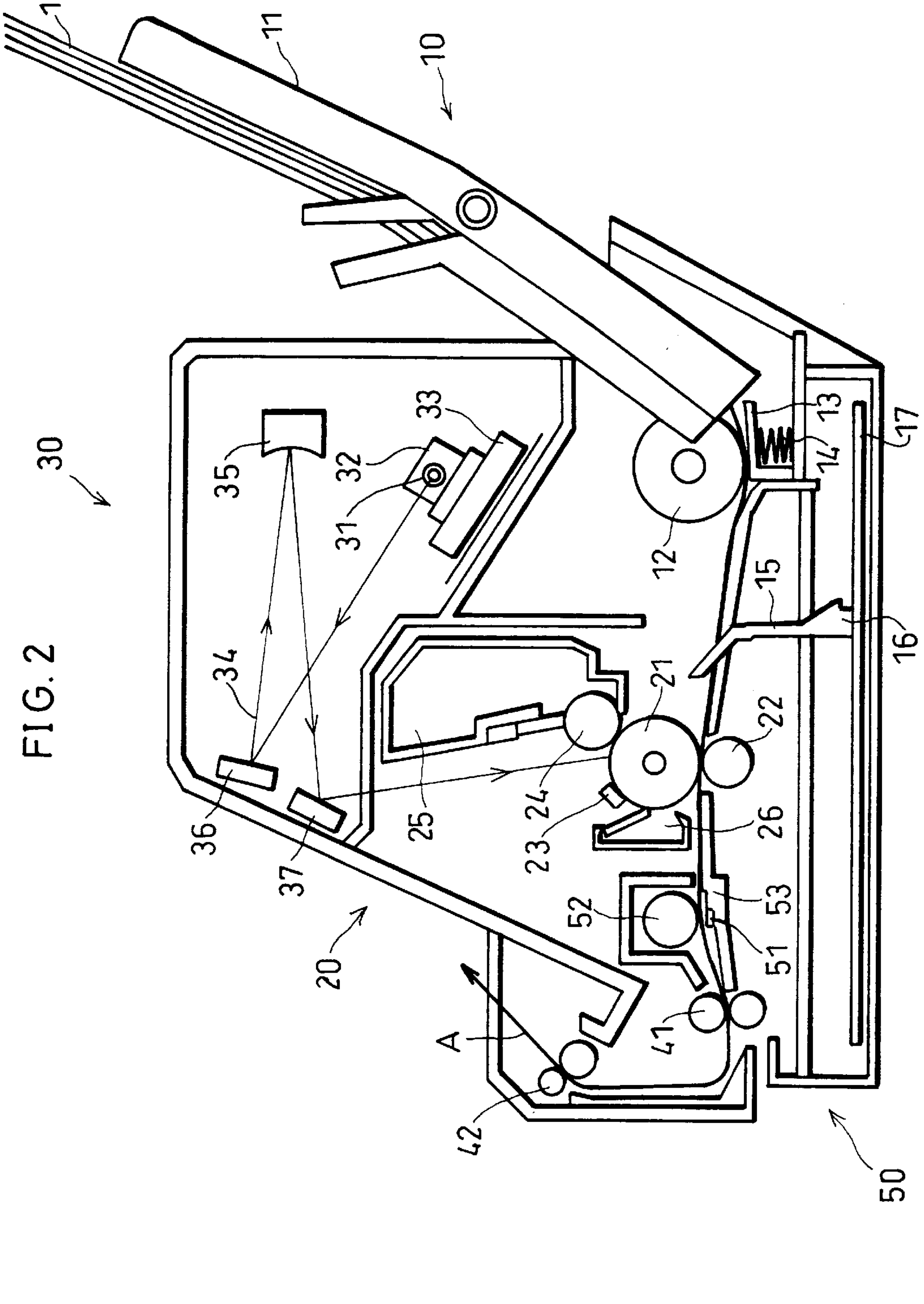
FIG. 2 is a cross-sectional view schematically showing a configuration of a laser printer having the fixing device.

The laser printer, as shown in FIG. 2, includes a paper feed section 10, an image forming device 20, a laser scanning section 30 and a fixing device 50 that is in accordance with the present invention.

The paper feed section 10 transports a sheet of paper 1 as a recording material to the image forming device 20 provided in the printer. The image forming device 20 transfers to the transported sheet of paper 1 a toner image 2 that is in accordance with an electrostatic latent image formed by the laser scanning section 30. The fixing device 50 fixes toner to the sheet of paper 1 sent from the image forming device 20. Thereafter, the sheet of paper 1 is ejected out of the laser printer by paper transport rollers 41 and 42. In short, the sheet of paper 1 moves along the path denoted by the arrow A of a thick line in FIG. 2.

The paper feed section 10 includes a paper feed tray 11, a paper feed roller 12, a paper-separating-use friction plate 13, a pressure spring 14, a paper-detection actuator 15, a paper-detection optical sensor 16 and a control circuit 17.

As the laser printer receives a print instruction from an externally connected host computer (not shown), the sheets of paper 1 placed on the paper feed tray 11 are fed one by one by operation of the paper feed roller 12, the paper-separating-use friction plate 13 and the pressure spring 14. In other words, the sheets of paper 1 are sequentially fed into the laser printer. As the fed sheet of paper 1 pushes down the paper-detection actuator 15, the paper-detection optical sensor 16 outputs an electric signal in accordance with that information and thereby instructs the control circuit 17 to start printing of the image. The control circuit 17 started by the operation of the paper-detection actuator 15 transmits an image signal to a laser diode light-emitting unit 31 (to be described later in detail) of the laser scanning section 30 so as to control ON/OFF of the light emitting diode.

The laser scanning section 30 includes the laser diode light-emitting unit 31, a scanning mirror 32, a scanning mirror motor 33 and reflection mirrors 35, 36 and 37.

The scanning mirror 32 is rotated at a constant high speed by the scanning mirror motor 33. In other words, in FIG. 2, laser light 34 scans a photosensitive body 21 (to be described later in detail) along the axis thereof. The laser light 34 radiated by the laser diode light-emitting unit 31 is reflected by the reflection mirrors 35, 36 and 37 so as to be applied to the photosensitive body 21 of the image forming device 20. When the laser light 34 is applied to the photosensitive body 21, the surface of the photosensitive body 21 is selectively exposed to the laser light 34 in accordance with the ON/OFF information from the control circuit 17.

The image forming device 20 is provided with the photosensitive body 21, a transfer roller 22, a charging member 23, a developing roller 24, a developing unit 25 and a cleaning unit 26.

The surface of the photosensitive body 21 charged in advance to a predetermined potential by the charging member 23 is exposed by the laser light 34, and the surface charge of the charged photosensitive body 21 is selectively discharged. An electrostatic latent image is thus formed on the surface of the photosensitive body 21. Toner used for development is stored in the developing unit 25. The toner charged by being appropriately stirred in the developing unit 25 adheres to the surface of the developing roller 24. The toner image 2 in accordance with the electrostatic latent image is formed on the photosensitive body 21 by an interaction of an electric field generated by the developing bias voltage applied to the developing roller 24 and the surface potential of the photosensitive body 21.

Next, the sheet of paper 1 transported to the image forming device 20 from the paper feed section 10 is sent to the fixing device 50 while being pinched by the photosensitive body 21 and the transfer roller 22. Then, the toner image 2 on the photosensitive body 21 is electrically absorbed and transferred to the sheet of paper 1 by an interaction of the electric field generated by a transfer voltage applied to the transfer roller 22. In other words, the toner image 2 on the photosensitive body 21 is transferred to the sheet of paper 1 by the transfer roller 22, and the toner that still remains on the photosensitive body 21 without having been transferred yet is collected by the cleaning unit 26.

The sheet of paper 1 is further transported to the fixing device 50, which will be described later in detail. An appropriate temperature and pressure are applied to the sheet of paper 1, to which the toner image 2 has been transferred, by a press member 51 and a fixing roller 52 (both to be described later in detail) that is maintained at, for example, 155° C. The toner thereby melts and is fixed on the sheet of paper 1 to form the stable toner image (image) 2. The sheet of paper 1 is transported and ejected out of the laser printer by the paper transport rollers 41 and 42.

Figure 1:
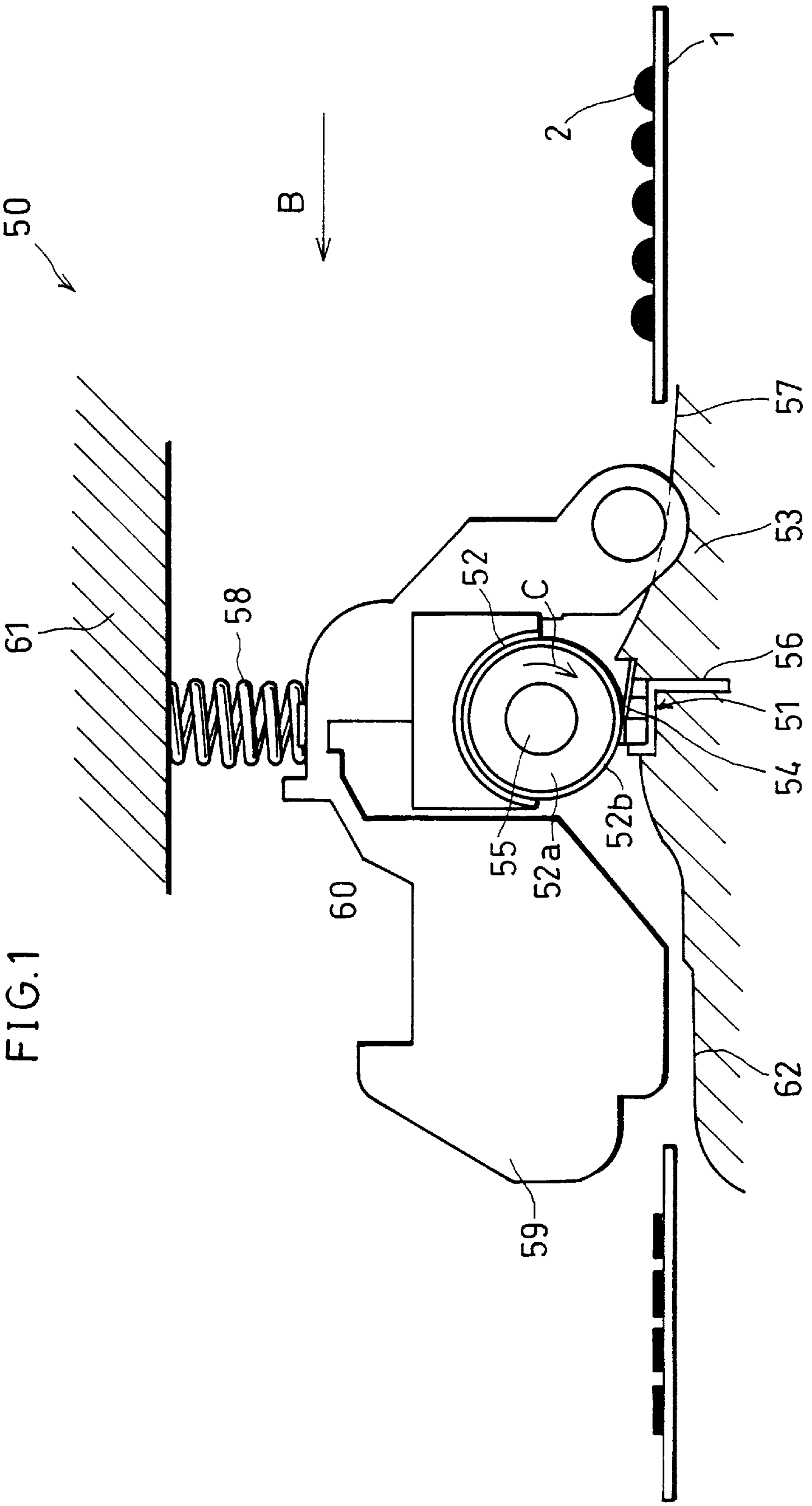
FIG. 1 is an explanatory drawing schematically showing a configuration of a fixing device of an embodiment in accordance with the present invention.

As shown in FIG. 1, the fixing device 50 has the fixing roller 52 disposed on an upper frame 61 and the press member 51 disposed on a lower frame 53. The fixing roller 52 is composed of, for example, a cylinder 52*a* (for example, 14 mm in diameter and 0.55 mm in thickness) made of relatively thin aluminum and a coating section 52*b* for coating the periphery surface of the cylinder 52*a*.

The coating section 52*b* is made of synthetic resin of good mold release, paper transport and heat resistance properties. The coating section 52*b* is, for example, formed by coating the cylinder 52*a* with a composition and then baking the cylinder 52*a*. The composition coating the cylinder 52*a* is a mixture of fluororesin of a good mold release property with heat resistant rubber of a good paper transport property such as fluororubber. The fixing roller 52 has a heater lamp 55 inserted in the axial portion thereof. The fixing roller 52 is heated by the heater lamp 55 and maintained at, for example, 155° C. by a temperature control device (not shown).

A semiarc bearing 60 (e.g., S-Bear 745 made by Starlite Industry) is disposed at each of the end portions with respect to the axial direction of the fixing roller 52, vertically to the metal portion of the cylinder of the fixing roller 52 and parallelly to the transport direction. The fixing roller 52 is so supported by the bearing 60 as to be freely rotatable in the direction denoted by the arrow C, thereby being capable of transporting the sheet of paper 1. The bearing 60 is coupled with a fixing cover 59 (Rynite 945, registered trademark of E. I. du Pont de Nemours and Co. for thermosetting polyester resin (GF-PET)) composed of, for example, heat resistant resin.

The fixing cover 59 is disposed downward on the upper frame 61 with a pressure spring 58. Therefore, the fixing roller 52 is configured to be pressed to the press member 51 by the pressure spring 58 via the fixing cover 59 and the bearing 60. In other words, the fixing roller 52 is pressed to the press member 51 by a push force of the pressure spring 58 having an applied pressure of, for example, 2,400 gf.

Figure 4:
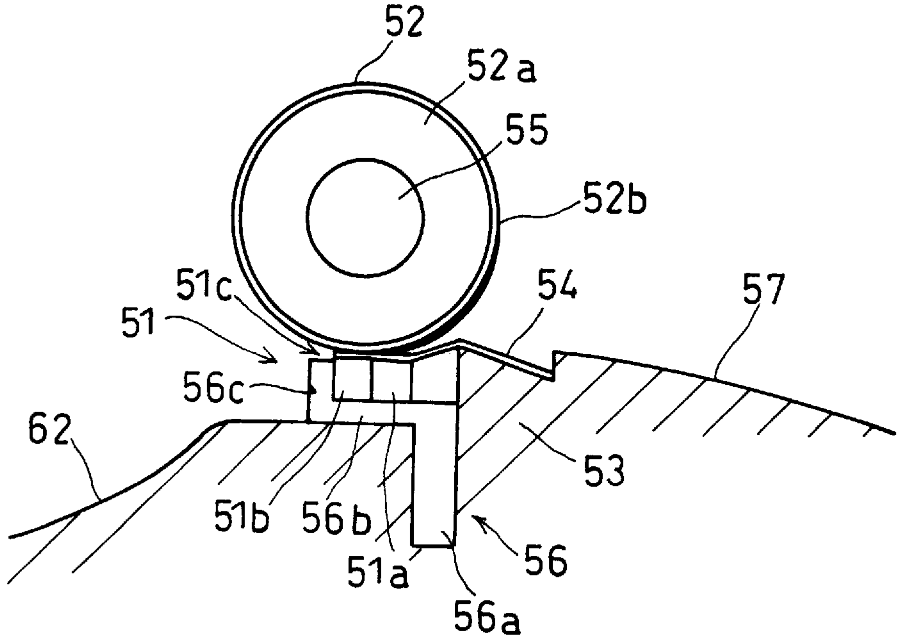
FIG. 4 a cross-sectional view showing a main part of the fixing device shown in FIG. 1.

As shown in FIG. 4, the press member 51 is provided along the axis of the fixing roller 52. The press member 51 is composed of an elastic body 51*c* pressed to the fixing roller 52 via a heat resistant sheet 54 and a Z-curved metal plate 56 for fixing the elastic body 51*c* to the lower frame 53. The elastic body 51*c* is composed of a pressure portion 51*b* forming the nip portion by being pressed to the fixing roller 52 via the heat resistant sheet 54 and a guide portion 51*a* provided on the upstream side of the pressure portion 51*b* with respect to the direction along which the sheet of paper 1 is transported. The guide portion 51*a* is so formed that the free height (height when not pressed) thereof is lower than the free height of the pressure portion 51*b*. The guide portion 51*a* and the pressure portion 51*b* are pasted together.

The pressure portion 51*b* is made of, for example, silicon sponge rubber (e.g., TL 4400 made by INOAC) of 3 mm in thickness (i.e., the free height) and 2 mm in width (i.e., the width with respect to the transport direction of the sheet of paper 1). The guide portion 51*a* is made of silicon sponge rubber of 2 mm in thickness and 2 mm in width.

The Z-curved metal plate 56 is provided along the axis of the fixing roller 52, and has a cross-sectional view, taken vertically to the axial direction, of a pseudo Z shape so as to be capable of fixing the elastic body 51*c* to the lower frame 53. The Z-curved metal plate 56 is composed of an embedded portion 56*a* embedded in the lower frame 53, a fixing portion 56*b* for fixing the guide portion 51*a* and the pressure portion 51*b*, and a stopper 56*c* for preventing the pressure portion 51*b* from falling down in the transport direction. The Z-curved metal plate 56 is made of SECC of a 1.2 mm thickness in a pseudo Z shape, and therefore has a predetermined strength.

The guide portion 51*a* and the pressure portion 51*b* are pasted onto the Z-curved metal plate 56 with, for example, heat resistant double coated tape (e.g., ET tape made by Nissan Packing). Moreover, the guide portion 51*a* and the pressure portion 51*b* are coupled at each of the end portions thereof with respect to the lengthwise direction with a boss (not shown) sticking out from the lower frame 53, and thereby fixed to the lower frame 53.

The heat resistant sheet 54 is provided over the press member 51, that is, between the pressure portion 51*b* and the fixing roller 52. The heat resistant sheet 54 is fixed at the upstream side thereof with respect to the transport direction to the lower frame 53 with, for example, heat resistant double coated tape. The heat resistant sheet 54 has a thickness of, for example, 300 μm and is composed of synthetic resin material of good mold release and heat resistant properties. Examples of such synthetic resin material include a mixture of fluororesin, such as polytetrafluoroethylene-perfluoroalkylvinyleter copolymer resin (PFA) and polytetrafluoroethylene resin (PTFE), and heat resistant filler, such as carbon, molybdenum, graphite, boron nitride and polyimide. The heat resistant sheet 54 of the present invention is a sheet of PTFE mixed with 5% polyimide filler.

The upstream side of the lower frame 53 from the press member 51 with respect to the transport direction is formed to be higher than the fixing portion of the press member 51 almost by the thickness of the press member 51 and the heat resistant sheet 54. The embedded portion 56*a* of the Z-curved metal plate 56 is embedded in the boundary area where the lower frame 53 changes its height in this manner. A transport guide 57 for guiding the sheet of paper 1 to be transported into the nip portion is provided on the upstream side of the lower frame 53 with respect to the transport direction. Meanwhile, on the downstream side of the lower frame 53 with respect to the transport direction is provided a fixing guide 62 for guiding the sheet of paper 1, to which the toner image 2 has been fixed, to be transported out of the nip portion.

In the above configuration, the sheet of paper 1, to which the toner image 2 has been transferred but not yet fixed, moves along the transport direction (the direction denoted by the arrow B in FIG. 1) and is guided by the transport guide 57 to pass the nip portion formed between the fixing roller 52 and the heat resistant sheet 54. The fixing roller 52 rotates in the transport direction (the direction denoted by the arrow C in FIG. 1). Since the transportation force of the sheet of paper 1 by the fixing roller 52 is stronger than the frictional force between the fixing roller 52 and the sheet of paper 1, the sheet of paper 1 is transported by the rotational force of the fixing roller 52.

The fixing roller 52 is heated by the heater lamp 55 to be maintained at, for example, 155° C. by the temperature control device (not shown). Thereby, the toner image 2 that is electrostatically sticking to the sheet of paper 1 without being fixed is fixed to the sheet of paper 1 with the heat and pressure applied by the fixing roller 52. Thereafter, the sheet of paper 1 is guided by the fixing guide 62 and ejected out of the machine via the paper transport rollers 41 and 42. The toner image 2 that has not yet been fixed is fixed to the sheet of paper 1 in this manner.

Figure 3:
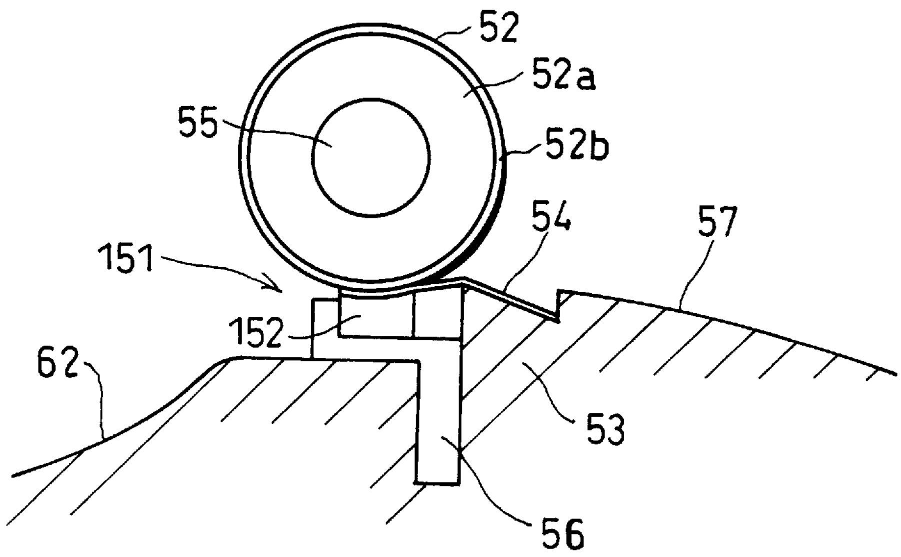
FIG. 3 is a cross-sectional view schematically showing a configuration of a conventional fixing device that uses a press member having a flat plate shape.
Figure 5:
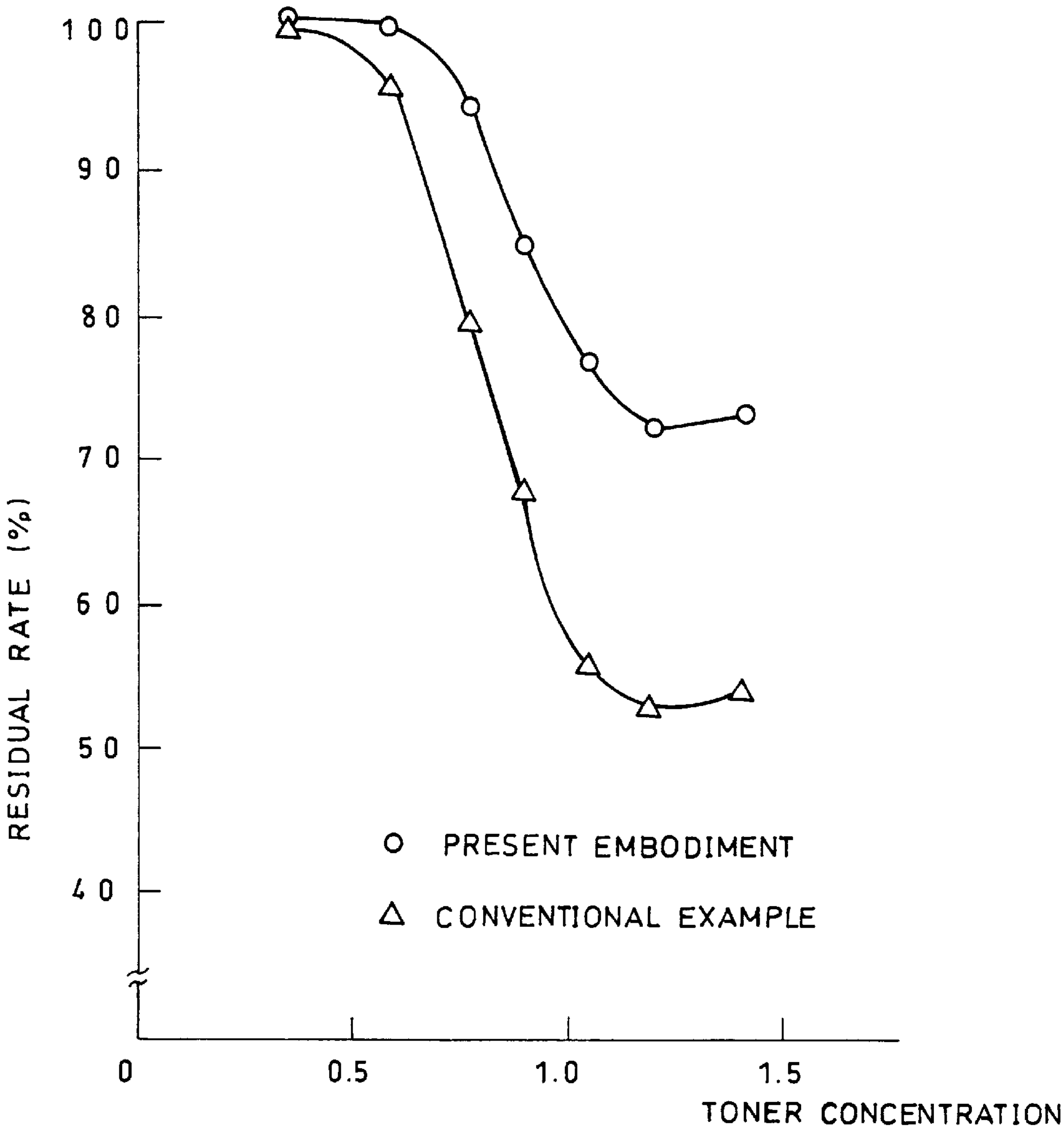
FIG. 5 is a graph for comparison between fixing properties of the conventional fixing device shown in FIG. 3 and those of the fixing device shown in FIG. 4 in accordance with the present invention.

Referring to FIGS. 3 through 5, the following description will discuss effects achieved by the press member 51 of the present embodiment, in comparison with a conventional press member.

As shown in FIG. 3, an elastic body 152 of a press member 151 in a conventional fixing device has the same free height at the first part thereof where the nip portion is formed by pressing the elastic body 152 to the fixing roller 52 via the heat resistant sheet 54 and at the second part thereof that is on the upstream side of the first part with respect to the transport direction. In other words, the elastic body 152 of the press member 151 is so formed to be uniform in free height.

By contrast, as shown in FIG. 4, the elastic body 51*c* of the press member 51 of the fixing device 50 of the present embodiment is composed of the pressure portion 51*b* and the guide portion 51*a*. The free height of the guide portion 51*a* is lower than that of the pressure portion 51*b*.

An elastic body of a uniform thickness decreases its apparent elasticity hardness with a decrease of its width. More specifically, when silicon sponge of, for example, 3 mm in thickness (free height) and 3 mm in width (width with respect to the transport direction) is used as the elastic body 152, the apparent elasticity hardness is 30°. When the elastic body 152 is pressed to the fixing roller 52, the nip width is 1 mm. On the other hand, when silicon sponge, made of the same material, of 3 mm in thickness and 2 mm in width is used as the elastic body 51*c* (i.e., as the press section 51*b*), the apparent elasticity hardness is 25. When the elastic body 51*c* is pressed to the fixing roller 52, the nip width is 1.5 mm.

In other words, since the apparent elasticity hardness of the elastic body 152 is relatively large in the conventional fixing device, the nip width becomes small. Therefore, the toner image 2 is not fixed well to the sheet of paper 1. Besides, since the elastic body 152 is formed to be uniform in free height, the transport path of the sheet of paper 1 to the nip portion becomes narrower suddenly. Therefore paper jam, such as paper lodging, and improper paper insertion are likely to occur.

By contrast, since the apparent elasticity hardness of the elastic body 51*c,* i.e., of the pressure portion 51*b,* is relatively small in the fixing device 50 of the present embodiment, the nip width becomes large. Therefore, the toner image 2 is fixed well to the sheet of paper 1. Besides, since the elastic body 51*c* is composed of the pressure portion 51*b* and the guide portion 51*a,* and the guide portion 51*a* is formed to have a lower free height than the pressure portion 51*b,* the transport path of the sheet of paper 1 to the nip portion becomes narrower gradually. Therefore, paper jam, such as paper lodging, and improper paper insertion are less likely to occur.

Moreover, the conventional fixing device that uses the press member 151 and the fixing device 50, of the present embodiment, that uses the press member 51 were compared with respect to the correlation between the toner concentration and the fixing of the toner image 2. The fixing was evaluated in residual rate (%) by rubbing test.

The rubbing test was carried out, with paper of 128 $g/m^2$ in basis weight used as the sheet of paper 1, by rubbing the toner image 2 fixed on the sheet of paper 1 with a predetermined stress under the following conditions: room temperature of 5° C. and humidity of 20%. The residual rate was defined as 100% when the toner image 2 does not come off at all from the sheet of paper 1 and 0% when the toner image 2 comes off (disappears) completely from the sheet of paper 1. A higher residual rate was interpreted as better fixing. FIG. 5 is a graph showing the results.

As clearly shown in FIG. 5, the fixing device 50 of the present invention has a higher residual rate, and therefore carries out better fixing than the conventional fixing device. In other words, it is shown that the use of the press member 51 configured as above has improved the fixing of the toner image 2 to the sheet of paper 1.

As described above, the fixing device 50 of the present embodiment is configured so that the free height of the guide portion 51*a* of the elastic body 51*c* with respect to the transport direction of the sheet of paper 1 is lower than that of the pressure portion 51*b*. Therefore, since the apparent elasticity hardness of the pressure portion 51*b* can be made relatively small, the nip width can be made large. Therefore the fixing of the toner image 2 to the sheet of paper 1 is improved. In addition, the transport path of the sheet of paper 1 to the nip portion can be made to become narrower gradually by using the elastic body 51*c* configured as above. Consequently, even when, for example, a thin sheet of paper or an envelope is used as the sheet of paper 1, the fixing device 50 can suppress occurrence of paper jam, such as paper lodging, and improper paper insertion.

Furthermore, in the present embodiment, the elastic body 51*c* of the press member 51 is composed of the guide portion 51*a* and the pressure portion 51*b* that have different free heights from each other. However, the elastic body 51*c* is not necessarily configured as above. In other words, the elastic body 51*c* only needs to formed so that the free height thereof on the upstream side with respect to the transport direction of the sheet of paper 1 is lower than that of the portion thereof that is pressed to the fixing roller 52. More specifically, for example, the elastic body 51*c* may be formed in a taper shape, wherein the free height thereof on the upstream side with respect to the transport direction is lower than the free height of the pressed portion thereof.

Besides, the elastic body 51*c* may be composed of three or more elastic bodies (elastic bodies corresponding to the guide portion and the pressing portion) of different heights from each other. In the present embodiment, the diameter of the fixing roller 52 is set to 14 mm. However, for example, when the diameter of the fixing roller 52 is 30 mm, the elastic body 51*c* is most preferably composed of an elastic body of 2 mm in thickness (i.e., free height) and 2 mm in width, an elastic body of 2.5 mm in thickness and 2 mm in width, and an elastic body of 3 mm in thickness and 2 mm in width sequentially from the upstream side toward the downstream side with respect to the transport direction of the sheet of paper 1.

Moreover, the fixing portion 56*b* of the Z-curved metal plate 56 may have different heights at the portion thereof for fixing the guide portion 51*a* and at the portion thereof for fixing the pressure portion 51*b*. In other words, the fixing portion 56*b* may be configured, for example, to be higher at the portion for fixing the pressure portion 51*b* than at the portion for fixing the guide portion 51*a* so that the pressure portion 51*b* comes closer to the fixing roller 52 than the guide portion 51*a*. When the guide portion 51*a* and the pressure portion 51*b* configured in this manner, even if of the same thickness, are fixed to the Z-curved metal plate 56, the free height of the pressure portion 51*b* is seemingly higher than that of the guide portion 51*a*. This achieves the same effects as when the guide portion 51*a* and the pressure portion 51*b* have different free heights from each other.

[SECOND EMBODIMENT]

Figure 6:
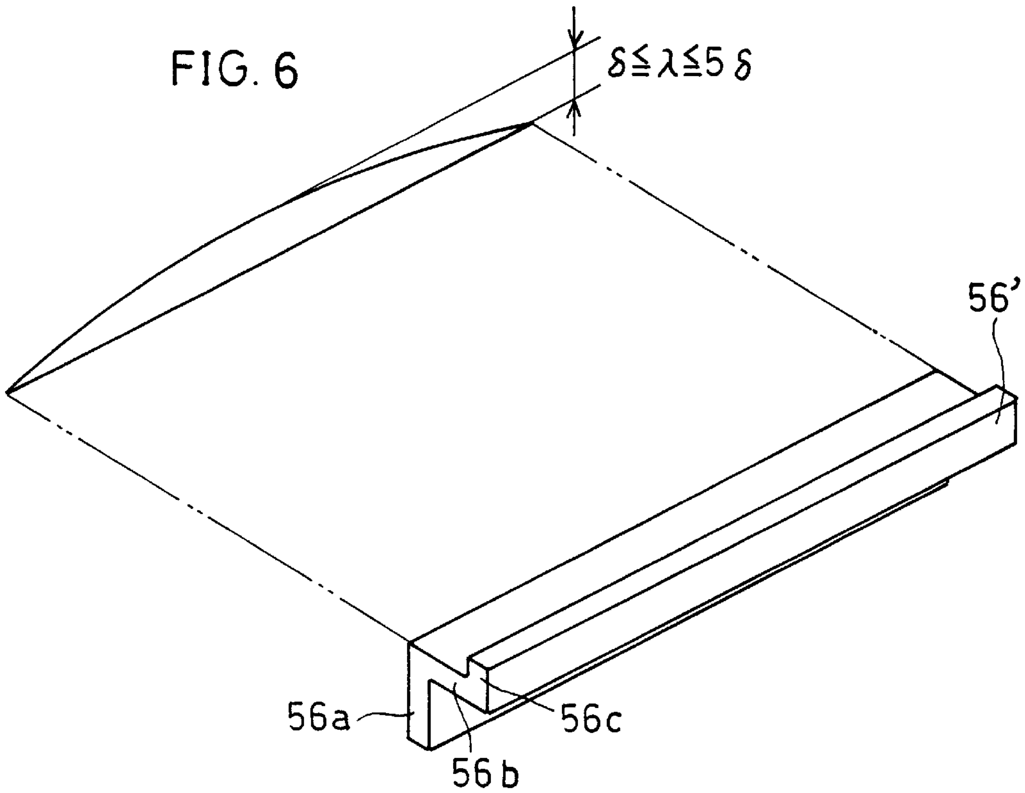
FIG. 6 is a perspective view schematically showing a Z-curved metal plate used for a fixing device of another embodiment in accordance with the present invention.
Figure 7:
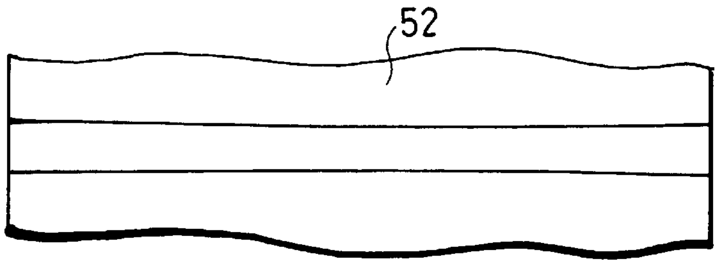
FIG. 7(*a*) is an explanatory drawing showing a nip portion formed by a concave Z-curved metal plate, and FIG. 7(*b*) is an explanatory drawing showing a nip portion formed by the convex Z-curved metal plate shown in FIG. 6.
Figure 7:
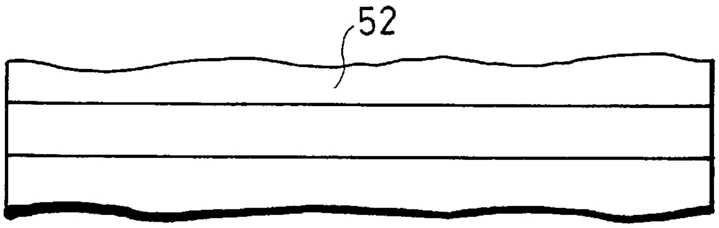

Next, referring to FIGS. 6, 7(*a*) and 7(*b*), the following description will discuss another embodiment in accordance with the present invention. Here, for convenience, members of the present embodiment that have the same arrangement and function as members of the first embodiment, and that are mentioned in the first embodiment are indicated by the same reference numerals and description thereof is omitted.

As shown in FIG. 6, a Z-curved metal plate 56' of a fixing device 50 of the present embodiment is configured, with respect to the axial direction of a fixing roller 52, so that a fixing portion 56*b* is higher toward the fixing roller 52 at the mid-portion thereof than at the end portions thereof. That is, the Z-curved metal plate 56' is configured so that the fixing portion 56*b* has a convex form where the mid-portion thereof bulges. The fixing device 50 here has the same configuration as the fixing device 50 of the first embodiment, except for the Z-curved metal plate 56'.

In the above configuration, the correlation between the shape of the fixing portion 56*b* of the Z-curved metal plate 56', that is, the bulging amount λ (mm) of the mid-portion, and the fixing of the toner image 2 was evaluated. λ represents the bulging amount of the mid-portion of the fixing portion 56*b* with respect to the end portions thereof (difference in height between at the end portions and at the mid-portion), thereby having a positive value when the mid-portion is convex and a negative value when the mid-portion is concave.

The fixing was evaluated by the rubbing test, with the toner concentration of the toner image 2 rated as 1.0 (constant). More specifically, after the fixing operation was continuously conducted with ten sheets of paper 1, the residual rate (%) was determined by conducting the rubbing test with the mid-portion and with the end portions of each sheet of paper 1. Next, the average value of the ten sheets was calculated for the average residual rate (%) of the mid-portion and for that of the end portions. The results were marked as good when neither of the two average residual rates was lower than 80%, as normal when one of the average residual rates was not lower than 60% and was lower than 80%, and as poor when either of the average residual rates was lower than 60%. These results are shown in Table 1.

TABLE 1

| BULGING AMOUNT λ (mm) | AVERAGE RESIDUAL RATE (%) MID-PORTION | END PORTION | EVALUATION |
|---|---|---|---|
| −0.1 | 52.5 | 85.5 | Poor |
| 0 | 63.8 | 84.6 | Normal |
| 0.1 | 81.5 | 83.9 | Good |
| 0.3 | 85.3 | 80.8 | Good |
| 0.5 | 86.7 | 74.2 | Normal |

As clearly shown in FIG. 1, the fixing of the toner image 2 to the sheet of paper 1 was improved at both the mid-portion and the end-portions by using the Z-curved metal plate 56' configured so that the mid-portion of the fixing portion 56*b* has a convex shape.

Since the fixing roller 52 is pressed to the press member 51 by the pressure spring 58, the push force of the pressure spring 58 is difficult to be applied at the mid-portion thereof, compared to the end portions thereof. Therefore, in order to improve the fixing of the toner image 2 to the sheet of paper 1 on the whole sheet of paper, it is necessary to apply equal push forces to the mid-portion and to the end portions. However, when a Z-curved metal plate configured so that the mid-portion of the fixing portion thereof has a concave shape is used, it is impossible to increase the push force applied to the mid-portion. Therefore, as shown in FIG. 7(*a*), the nip width of the nip portion formed by the fixing roller 52 and the elastic body 51*c* becomes unequal. That is, the nip width of the mid-portion becomes narrow, compared to the nip width of the end portions with respect to the axial direction of the fixing roller 52. Therefore, the fixing at the mid-portion of the sheet of paper 1 becomes poor.

On the other hand, when the Z-curved metal plate 56' configured so that the mid-portion of the fixing portion 56*b* has a convex shape is used, it is possible to increase the push force applied to the mid-portion. Therefore, as shown in FIG. 7(*b*), the nip width of the nip portion formed by the fixing roller 52 and the elastic body 51*c* becomes wider than in a conventional configuration, and thereby becomes uniform. That is, the nip width of the mid-portion becomes equal to the nip width of the end portions with respect to the axial direction of the fixing roller 52. Therefore, the fixing on the whole sheet of paper 1 is improved. In other words, the fixing of the toner image 2 to the sheet of paper 1 is improved.

Moreover, in the fixing device of the conventional roller method, the metal shaft of the fixing roller needs to be hard and strong in order to increase the push force applied to the mid-portion and thereby make the nip width uniform. However, in the fixing device 50 of the present embodiment, since the nip width can be made uniform with the Z-curved metal plate 56', and the metal shaft of the fixing roller 52 dose not need to be hard and strong. Consequently, the fixing device 50 can reduce its size and costs.

Next, the following will discuss the most appropriate range of the bulging amount λ of the mid-portion of the fixing portion 56*b*. Generally, the maximum deflection δ (mm) of the fixing roller 52 is given by the equation:

$$\delta=5WL^3/384EI$$

wherein E ($kg/mm^2$) is the longitudinal elastic modulus (Young's modulus), I is the second moment of area, W (kg) is the total load, L (mm) is the length of the fixing roller. Here, the longitudinal elastic modulus E is a value expressed as a ratio of the simple vertical stress applied to the fixing roller 52 to the longitudinal deflection in the direction where the simple vertical stress is applied. Moreover, the second moment of area I is a value obtained by first determining the second moment of a tiny area in a cross section of the fixing roller 52 and then integrating the second moment of the tiny area for the whole cross section of the fixing roller 52.

The fixing roller 52 of the present embodiment has a diameter of 14 mm, a thickness of 0.55 mm, a length of 230 mm and a total load of 2.4 kg. Therefore, the maximum deflection 6 of the fixing roller 52 is 0.08 mm according to the above equation.

Here, the bulging amount X of the mid-portion of the fixing portion 56*b* of the Z-curved metal plate 56' needs to be large enough to absorb the deflection of the fixing roller 52. Therefore, the bulging amount λ needs to be at least not smaller than the maximum deflection 6. As is clear from the evaluation of the fixing by the rubbing test, if the bulging amount λ exceeds 0.4 mm that corresponds to 5δ, the fixing becomes poor at the end portions of the sheet of paper 1. Therefore, the bulging amount λ is, most appropriately, in the range of 0.08 mm to 0.40 mm, that is, not less than 6 and not more than 5δ. A fixing roller having a diameter of 30 mm, a thickness of 0.70 mm, a length of 230 mm and a total load of 3.0 kg shows a maximum deflection 6 of 0.01 mm. Therefore, the bulging amount λ is, most appropriately, in the range of 0.01 mm to 0.05 mm.

In the present embodiment, the nip width is made uniform by using the Z-curved metal plate 56' configured so that the mid-portion of the fixing portion 56*b* has a convex shape. However, the press member 51 is not necessarily configured as above. For example, instead of forming the Z-curved metal plate 56' in a convex shape, the pressure portion 51*b* of the elastic body 51*c* may be formed so that the mid-portion thereof bulges more than the end portions thereof with respect to the axial direction of the fixing roller 52. Also in this case, since the nip width can be made more uniform and wider than in a conventional case, the same effects can be achieved as in the case where the Z-curved metal plate 56' is formed in a convex form.

[THIRD EMBODIMENT]

Figure 8:
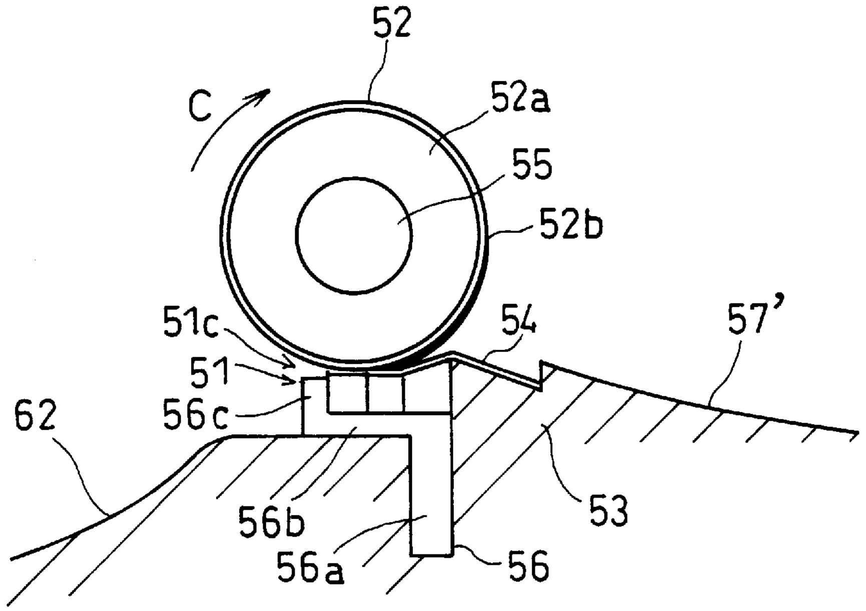
FIG. 8 is a cross-sectional view showing a main part of a fixing device of still another embodiment in accordance wit the present invention.
Figure 9A:
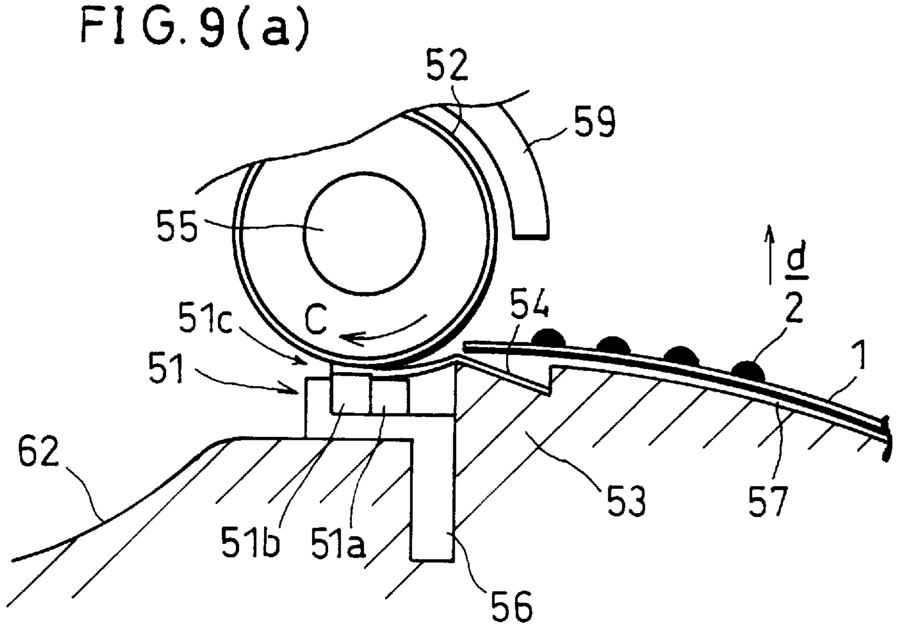
FIG. 9(*a*) is a cross-sectional view showing a main part of a fixing device having a convex transport guide, and FIG. 9*b*() is a cross-sectional view showing a main part of a fixing device having a concave transport guide.
Figure 9:
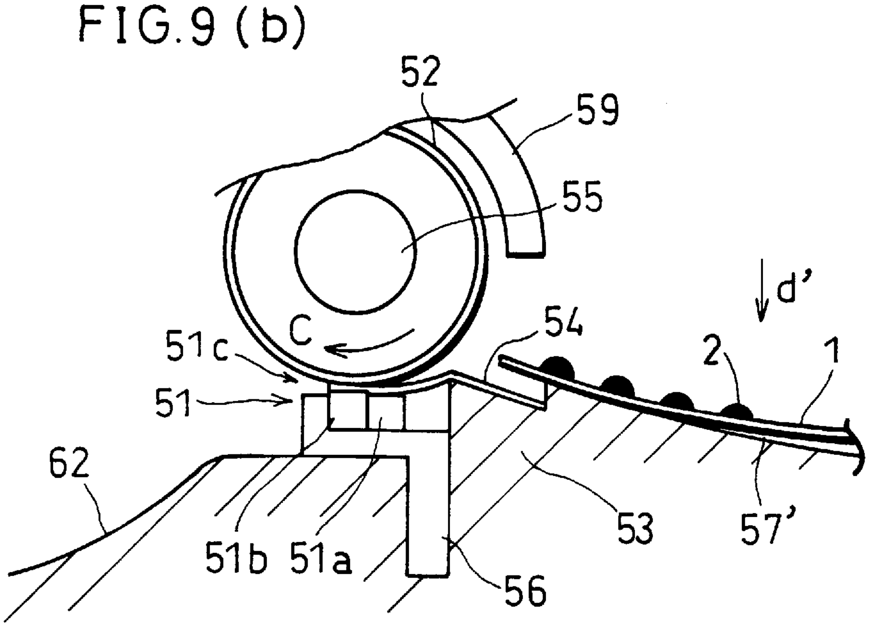
Figure 10:
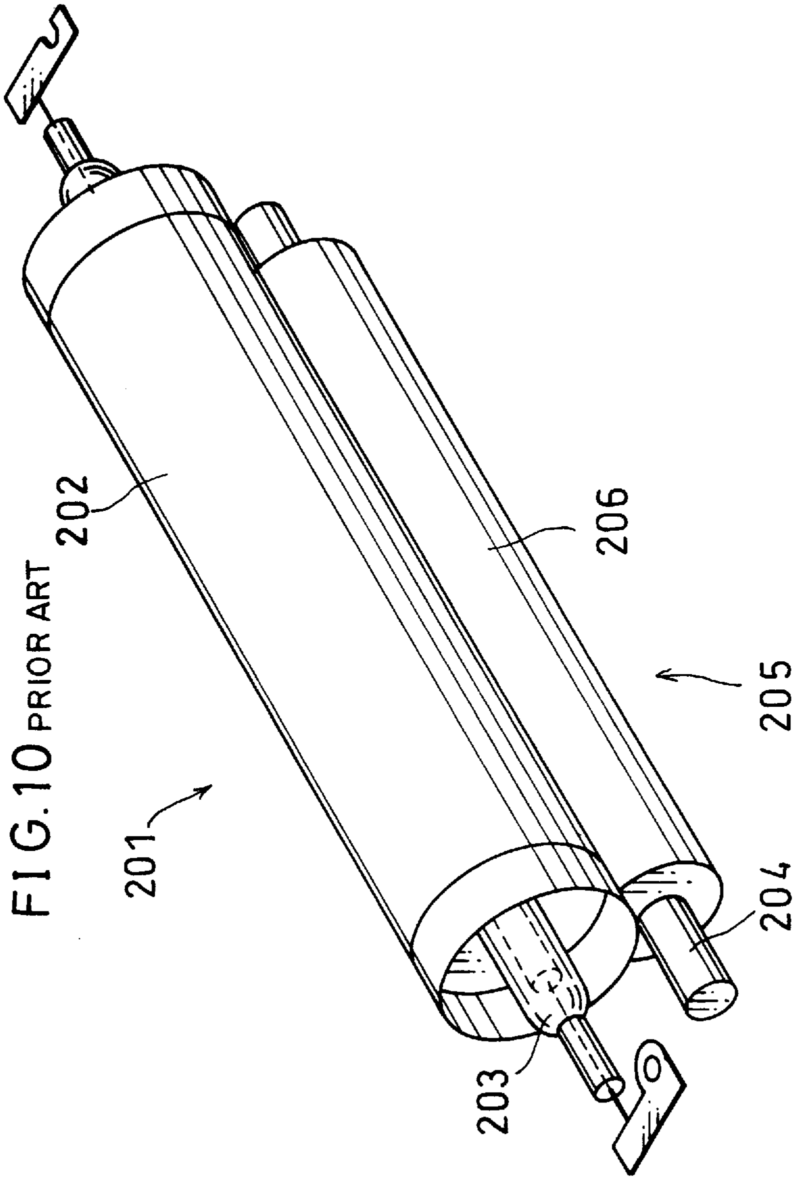
FIG.10 PRIOR ART
FIG. 10 is a perspective view showing a main part of a conventional fixing device employing a pressure roller method.
Figure 11:
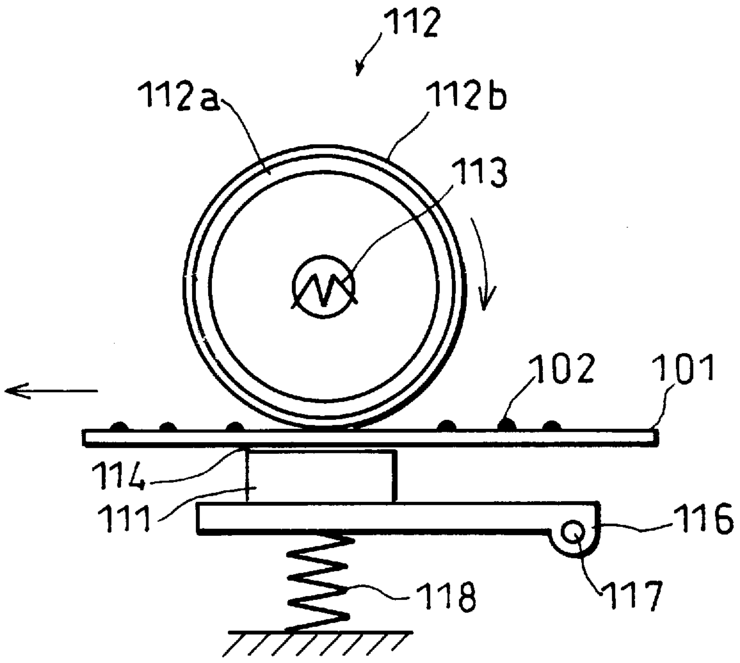
FIG. 11 PRIOR ART
FIG. 11 is a perspective view showing a main part of a conventional fixing device employing a press pad method.

Referring to FIGS. 8, 9(*a*) and 9(*b*), the following description will discuss even another embodiment in accordance with the present invention. Here, for convenience, members of the present embodiment that have the same arrangement and function as members of the first or second embodiment, and that are mentioned in the first or second embodiment are indicated by the same reference numerals and description thereof is omitted.

As shown in FIGS. 8 and 9(*b*), a transport guide 57' of the fixing device 50 of the present embodiment is configured to be upwardly concave with respect to the transport direction of the sheet of paper 1. In the present embodiment, the transport guide 57' is set to have a radius (R) of, for example, 80 mm. Since the transport guide 57' is configured to be upwardly concave, the sheet of paper 1 is transported diagonally up to the nip portion as it moves close to the nip portion.

Incidentally, in the fixing device 50 of the first and second embodiments, as shown in FIG. 9(*a*), the transport guide 57 is configured to be upwardly convex with respect to the transport direction of the sheet of paper 1 and set to have a radius (R) of, for example, 80 mm. Since the transport guide 57 is configured to be upwardly convex, the sheet of paper 1 is transported horizontally to the nip portion as it moves close to the nip portion. If soft paper, such as an envelope, a sheet of paper of 52 $g/m^2$ in basis weight (a thin sheet of paper), or a sheet of paper of 60 $g/m^2$ in basis weight, is used as the sheet of paper 1 in this case, the sheet of paper 1 may deflect (bend) upwardly (in the direction denoted by the arrow d in FIG. 9(*a*)) when inserted into the nip portion. Therefore, when such soft paper is used, paper jam, such as paper lodging, and improper paper insertion are likely to occur.

By contrast, as shown in FIG. 9(*b*), in the fixing device 50 of the present embodiment, the transport guide 57' is formed to be upwardly concave. In this case, if, for example, soft paper is used as the sheet of paper 1, the sheet of paper 1 may deflect (bend) downward (in the direction denoted by the arrow d' in FIG. 9(*b*)) when inserted into the nip portion. Therefore, even when such soft paper is used, the occurrence of paper jam, such as paper lodging, and improper paper insertion can be further suppressed by using the transport guide 57'.

Moreover, when the area of the toner image 2 that is to be fixed (i.e., print area) is large, such as solidly black-printed (100%), the friction between the fixing roller 52 and the sheet of paper 1 becomes smaller. That is, the sheet of paper 1 easily slips on the fixing roller 52. Therefore, it becomes difficult to transport the sheet of paper 1 with the rotational force of the fixing roller 52, and the sheet of paper 1 easily deflects between the transfer roller 22 (see FIG. 2) for transporting the sheet of paper 1 to the fixing device 50 and the fixing roller 52. Therefore, when the transport guide 57, that is formed to be upwardly convex, is used and the area of the toner image 2 is large, the sheet of paper 1 deflects upwardly (in the direction of the arrow d). The upward deflection of the sheet of paper 1 causes the toner image 2 that has not yet been fixed to be rubbed against, for example, the fixing cover 59 and may further causes improper image to occur.

By contrast, when the transport guide 57' formed to be upwardly concave is used, the sheet of paper 1 deflects downward (in the direction of the arrow d'). Therefore, even when the area of the toner image 2 is large, the toner image 2 that has not yet been fixed is not rubbed against, for example, the fixing cover 59 and thereby improper image is not likely to occur. In other words, the fixing of the toner image 2 to the sheet of paper 1 is further improved.

As mentioned above, the fixing device 50 of the present embodiment, the transport guide 57' is formed to be upwardly concave. Therefore, the sheet of paper 1 deflects (bends) downward when inserted into the nip portion. Therefore, even when soft paper is used, the occurrence of paper jam, such as paper lodging, and improper paper insertion can be further suppressed. In addition, even when the area of the toner image 2 is large, improper image is not likely to occur, and thereby the fixing of the toner image 2 to the sheet of paper 1 is further improved.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A fixing device, comprising:

a fixing roller; and a press member disposed in a press state in an axial direction of the fixing roller on the periphery surface of the fixing roller, wherein the press member is formed so that the free height of an upstream side thereof with respect to a transport direction of a recording material is lower than the free height of a pressure portion thereof with the fixing roller;

the press member including an elastic body composed of:

the pressure portion pressed to the fixing roller; and a guide portion disposed in a line with the pressure portion, wherein the guide portion has a lower free height than the free height of the pressure portion, and is disposed on the upstream side of the pressure portion with respect to the transport direction of the recording material, and said pressure portion and guide portions are separate bodies.

2. The fixing device as defined in claim 1, wherein the press member has a taper shape.

3. The fixing device as defined in claim 2, wherein the elastic body extends along the axial direction of the fixing roller, and is fixed to a Z-curved metal plate that has a cross-sectional view, taken vertically to the axial direction, of a pseudo Z shape.

4. The fixing device as defined in claim 3, wherein the Z-curved metal plate is formed to be higher toward the fixing roller at the mid-portion thereof than at the end portions thereof with respect to the axial direction of the fixing roller.

5. The fixing device as defined in claim 4, wherein a difference between the height at the end portions of the Z-curved metal plate and the height at the mid-portion of the Z-curved metal plate with respect to the axial direction of the fixing roller is not less than a maximum deflection of the fixing roller and not more than five times the maximum deflection.

6. The fixing device as defined in claim 2, wherein the pressure portion of the elastic body is formed to be higher toward the fixing roller at the mid-portion thereof than at the end portions thereof with respect to the axial direction of the fixing roller.

7. The fixing device as defined in claim 1, further comprising a transport guide for guiding and transporting the recording material to a nip portion of said fixing roller and said press member, wherein said transport guide is formed to be upwardly concave with respect to the transport direction of the recording material.

8. The fixing device as defined in claim 1, wherein the press member is composed of at least three elastic bodies disposed in a line.

9. A fixing device, comprising:

a fixing roller; and a press member disposed in a press state in an axial direction of the fixing roller on the periphery surface of the fixing roller, wherein only the press member is formed to be higher toward the fixing roller at the mid-portion thereof than at the end portions thereof with respect to the axial direction of the fixing roller.

10. The fixing device as defined in claim 9, wherein the press member includes an elastic body composed of:

the pressure portion pressed to the fixing roller; and a guide portion disposed in a line with the pressure portion, wherein the guide portion has a lower free height than the free height of the pressure portion and is disposed on the upstream side of the pressure portion with respect to the transport direction of the recording material.

11. The fixing device as defined in claim 9, wherein the elastic body extends along the axial direction of the fixing roller, and is fixed to a Z-curved metal plate that has a cross-sectional view, taken vertically to the axial direction, of a pseudo Z shape.

12. The fixing device as defined in claim 11, wherein the Z-curved metal plate is formed to be higher toward the fixing roller at the mid-portion thereof than at the end portions thereof with respect to the axial direction of the fixing roller.

13. The fixing device as defined in claim 12, wherein a difference between the height at the end portions of the Z-curved metal plate and the height at the mid-portion of the Z-curved metal plate with respect to the axial direction of the fixing roller is not less than a maximum deflection of the fixing roller and not more than five times the maximum deflection.

14. The fixing device as defined in claim 9, further comprising a transport guide for guiding the recording material to a nip portion of said fixing roller and said press member, wherein said transport guide is formed to be upwardly concave with respect to the transport direction of the recording material.

15. A fixing device, comprising:

a fixing roller;

a press member disposed in a press state in an axial direction of the fixing roller on the periphery surface of the fixing roller; and a transport guide for guiding a recording material to a nip portion of said fixing roller and said press member, wherein the transport guide is formed to be upwardly concave with respect to the transport direction of the recording material, and the transport guide is fixed.

16. A fixing device, comprising:

a fixing roller; and a press member disposed in a press state in an axial direction of the fixing roller on the periphery surface of the fixing roller, wherein the press member has a press surface for being pressed to the fixing roller and a guide surface for guiding a recording material to the press surface, the surfaces being separate, and opposite to the fixing roller, and the press surface has a first free height and the guide surface has a second free height which is lower than the first free height.

17. A fixing device, comprising:

a fixing roller; and a press member disposed in a press state in an axial direction of the fixing roller on the periphery surface of the fixing roller, wherein the press member has a plurality of surfaces that have respective different free heights, the surfaces being opposite to the fixing roller, and the free heights decrease in a direction opposite to a transport direction.

* * * * *